United States Patent
Hirose et al.

(10) Patent No.: US 9,007,843 B2
(45) Date of Patent: Apr. 14, 2015

(54) INTERNAL DATA COMPARE FOR MEMORY VERIFICATION

(75) Inventors: Ryan T. Hirose, Colorado Springs, CO (US); John W. Tiede, Colorado Springs, CO (US); Iustin Ignatescu, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 449 days.

(21) Appl. No.: 13/339,099

(22) Filed: Dec. 28, 2011

(65) Prior Publication Data

US 2013/0141984 A1    Jun. 6, 2013

Related U.S. Application Data

(60) Provisional application No. 61/566,370, filed on Dec. 2, 2011.

(51) Int. Cl.
 *G11C 11/34* (2006.01)
 *G11C 7/06* (2006.01)
 *G11C 16/34* (2006.01)

(52) U.S. Cl.
 CPC ................................ *G11C 16/3459* (2013.01)

(58) Field of Classification Search
 CPC ........ G11C 16/3436–16/3459; G11C 11/1677; G11C 11/2277; G11C 13/0066; G11C 16/3431
 USPC ........................... 365/185.22, 185.21, 189.07
 See application file for complete search history.

(56) References Cited

U.S. PATENT DOCUMENTS

| | | | |
|---|---|---|---|
| 6,122,197 A * | 9/2000 | Sinai et al. | 365/185.22 |
| 6,373,748 B2 | 4/2002 | Ikehashi et al. | |
| 6,937,524 B2 * | 8/2005 | Shiga et al. | 365/185.3 |
| 7,050,333 B2 | 5/2006 | Matsue | |
| 7,099,213 B2 | 8/2006 | Ju | |
| 7,184,310 B2 | 2/2007 | Vorraro et al. | |
| 7,227,778 B2 * | 6/2007 | Yamada | 365/185.05 |
| 7,254,049 B2 * | 8/2007 | Hartono et al. | 365/49.15 |
| 7,929,363 B1 | 4/2011 | Raghavan et al. | |
| 7,957,200 B2 | 6/2011 | Hibino | |
| 8,014,208 B1 | 9/2011 | Ferrante et al. | |
| 2003/0204797 A1 | 10/2003 | Lin | |
| 2006/0140027 A1 | 6/2006 | Tominaga | |
| 2008/0072119 A1 * | 3/2008 | Rozman | 714/763 |
| 2008/0151637 A1 * | 6/2008 | Doyle | 365/185.22 |
| 2010/0074011 A1 | 3/2010 | Kang et al. | |
| 2010/0080059 A1 | 4/2010 | Chen | |
| 2011/0188289 A1 * | 8/2011 | Chevallier et al. | 365/148 |
| 2013/0088919 A1 * | 4/2013 | Kim | 365/185.12 |
| 2013/0286746 A1 * | 10/2013 | Choi | 365/185.22 |

* cited by examiner

*Primary Examiner* — Vanthu Nguyen
*Assistant Examiner* — Khamdan Alrobaie
(74) *Attorney, Agent, or Firm* — Lowenstein Sandler LLP

(57) ABSTRACT

A method and apparatus to program data into a row of a non-volatile memory array and verify, internally to the non-volatile memory array, that the data was successfully programmed. The verification includes comparing the programmed data from the row of the non-volatile memory array to data in the plurality of high voltage page latches that were used to program the row.

17 Claims, 7 Drawing Sheets

INTERNAL DATA COMPARE FOR MEMORY VERIFICATION

RELATED APPLICATIONS

This application claims the benefit of U.S. Provisional Application No. 61/566,370 filed on Dec. 02, 2011, which is incorporated by reference.

TECHNICAL FIELD

This disclosure relates to the field of data storage and, in particular, to an internal data compare for memory verification.

BACKGROUND

Flash memory is one form of a non-volatile computer storage device that can be electrically erased and reprogrammed. It was developed from conventional electrically erasable programmable read-only memory (EEPROM) and is erased in fairly large blocks before the blocks can be rewritten with new data.

Certain types of flash memory used in memory cards, universal serial bus (USB) flash drives, solid-state drives, and similar products, for general storage and transfer of data. Other types, which allow random access and therefore direct code execution, are used as a replacement for the older EPROM and as an alternative to certain kinds of ROM applications. Example applications of flash memory include personal computers, PDAs, digital audio players, digital cameras, mobile phones, synthesizers, video games, scientific instrumentation, industrial robotics, medical electronics, and the like. In addition to being non-volatile, flash memory offers fast read access times. Its mechanic shock resistance, its high durability, being able to withstand high pressure, temperature, immersion in water etc., has led to popularity over hard disks in portable devices.

When writing a flash memory (i.e., erasing a block of data and reprogramming data to that block), it may be desirable to verify that the write operation was successful and accurate. Conventional flash memory designs have no means for performing an internal verification of write data. In these designs, verification of just written data is performed external to the flash memory at the system or chip level on which the flash memory is instantiated. During this verification, the just written data is usually sent through a low bandwidth interface to an on board microcontroller under firmware control. This typically takes many clock cycles to complete and may result in decreased performance of the system containing the flash memory.

BRIEF DESCRIPTION OF THE DRAWINGS

The present disclosure is illustrated by way of example, and not by way of limitation, in the figures of the accompanying drawings.

DETAILED DESCRIPTION

Figure 1:
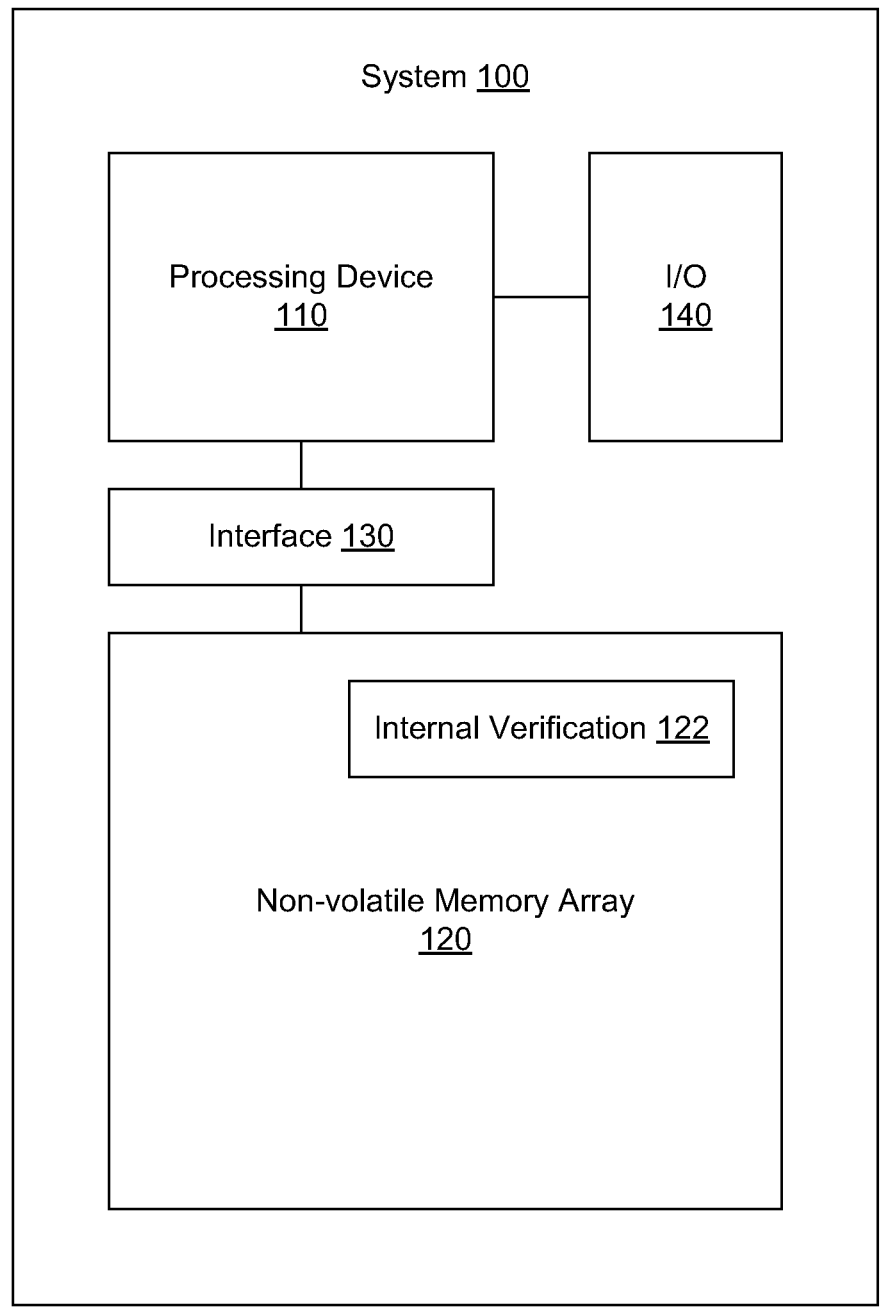
FIG. 1 is a block diagram illustrating an exemplary system for internal data comparison for memory verification, according to an embodiment.

The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Embodiments of a method and apparatus are described for an internal data comparison for memory verification. In systems implementing a memory, such as a flash memory array or other non-volatile memory array, it may be desirable to hardware verify data just programmed into the flash memory and optionally verify with some amount of margin, sense timing, sense current centering, etc., to maintain the integrity of the data in the worst case usage of the flash memory. In one embodiment, after a row of data has been programmed, the row is read from the flash memory and compared to actual program data stored, for example in high voltage (HV) page latches. After the comparison, a single bit may be set to signify that the programming of that row was successful.

In one embodiment, not only do the HV page latches hold the data to be programmed; but they may also provide the stored data to comparison circuitry for comparison against the data read out from the flash memory array. This data may be read out on a main output bus and, in one embodiment, may include 128 bits from a row of 4096 bits in the flash memory array. The HV page latches may have a one to one correspondence to each column in the flash memory array (i.e., each bit in a row of the flash memory array), where there are 4096 columns in the flash memory array corresponding to 4096 bits in a row. In order to verify that a row has been properly written, the row data read from the memory array should match the HV page latch data. In one embodiment, the comparison must be done for each 32 reads of the 128 bits to check that all 4096 bits in a row have been written properly.

The comparison may be done on a bit by bit basis and the results may be compressed down to a single compare bit. In one embodiment, if the compare bit is high for each 128 bit comparison, the data in the HV page latches may match the data read from the flash memory array. To verify the entire row written, 32 reads may be performed checking the compare bit for each read, or the compare bit can be accumulated for all 32 reads (e.g., using resistor-transistor logic (RTL)) and checked once after all 32 reads are complete. Thus, once data is written to the HV page latches, data does not have to be read out of the flash memory and checked against data stored in a static random access memory (SRAM) buffer or tested to verify that the data was written to the flash memory row address. In one embodiment, to facilitate the data transfer into the HV page latches, the input bus width may be increased to 32 bits and the input frequency can be as high as 200 megahertz.

FIG. 1 is a block diagram illustrating an exemplary system for internal data comparison for memory verification, according to an embodiment of the present invention. In one embodiment, system 100 may include processing device 110 and non-volatile memory array 120. System 100 may further include an interface 130 between processing device 110 and non-volatile memory array 120 and input/output (I/O) circuitry 140 to interface with other systems or devices. In other embodiments, system 100 may include different and/or additional components or subsystems which are not described herein, so as not to obscure the present invention. System 100 may be any system (or part of a system) employing a memory, such as non-volatile memory array 120, and may include, for example, a personal computer, a mobile phone, a digital audio player, a digital camera, a laptop or tablet computer, a microcontroller, or other similar device. In another embodiment, system 100 and non-volatile memory array 120 may be included as a subsystem incorporated into a larger system, such as one described above.

Processing device 110 may represent one or more general-purpose processing devices such as a microprocessor, central processing unit, or the like. More particularly, the processing device 110 may be a complex instruction set computing (CISC) microprocessor, reduced instruction set computing (RISC) microprocessor, very long instruction word (VLIW) microprocessor, or a processing device implementing other instruction sets or processors implementing a combination of instruction sets. The processing device 110 may also be one or more special-purpose processing devices such as an application specific integrated circuit (ASIC), a field programmable gate array (FPGA), a digital signal processor (DSP), network processor, or the like. The processing device 110 may be configured to program data, received over I/O circuitry 140, into non-volatile memory array 120 through interface 130.

Non-volatile memory array 120 may be one example of a memory device used by system 100 to store data. Non-volatile memory array 120 may include, for example a flash memory array or another non-volatile computer storage device that can be electrically erased and reprogrammed. In one embodiment the non-volatile memory array 120 may be formed from a number of Silicon-Oxide-Nitride-Oxide-Silicon (SONOS) memory cells. The cells may be arranged into an array or rows and columns, each configured to store one bit of information. In other embodiments, some other type of memory cells may be used to form the array 120. The description herein may refer to an embodiment where non-volatile memory array 120 is referred to as flash memory array 120, however, it should be understood that other types of non-volatile storage may be used, such as EEPROM, non-volatile latch, magnetorestive random access memory (MRAM) or others.

In one embodiment, flash memory array 120 includes internal verification circuit 122. Internal verification circuit may allow for the verification of data programmed into the flash memory array without the need to send the data outside the array (e.g., through interface 130). The internal verification circuit 122 may include comparison circuitry, such that after a row of data has been programmed, portions of the row are read from the flash memory array 120 and compared to actual program data stored, for example, in HV page latches in flash memory array 120. After the comparison, a comparison bit may be set to signify that the programming of that portion of the row was successful. The internal verification circuit 122 may further include compression circuitry to combine these comparison bits to a single bit representing the comparison for the entire row programming operation. Additional details of flash memory array 120 and internal verification circuit 122 are provided below.

Figure 2:
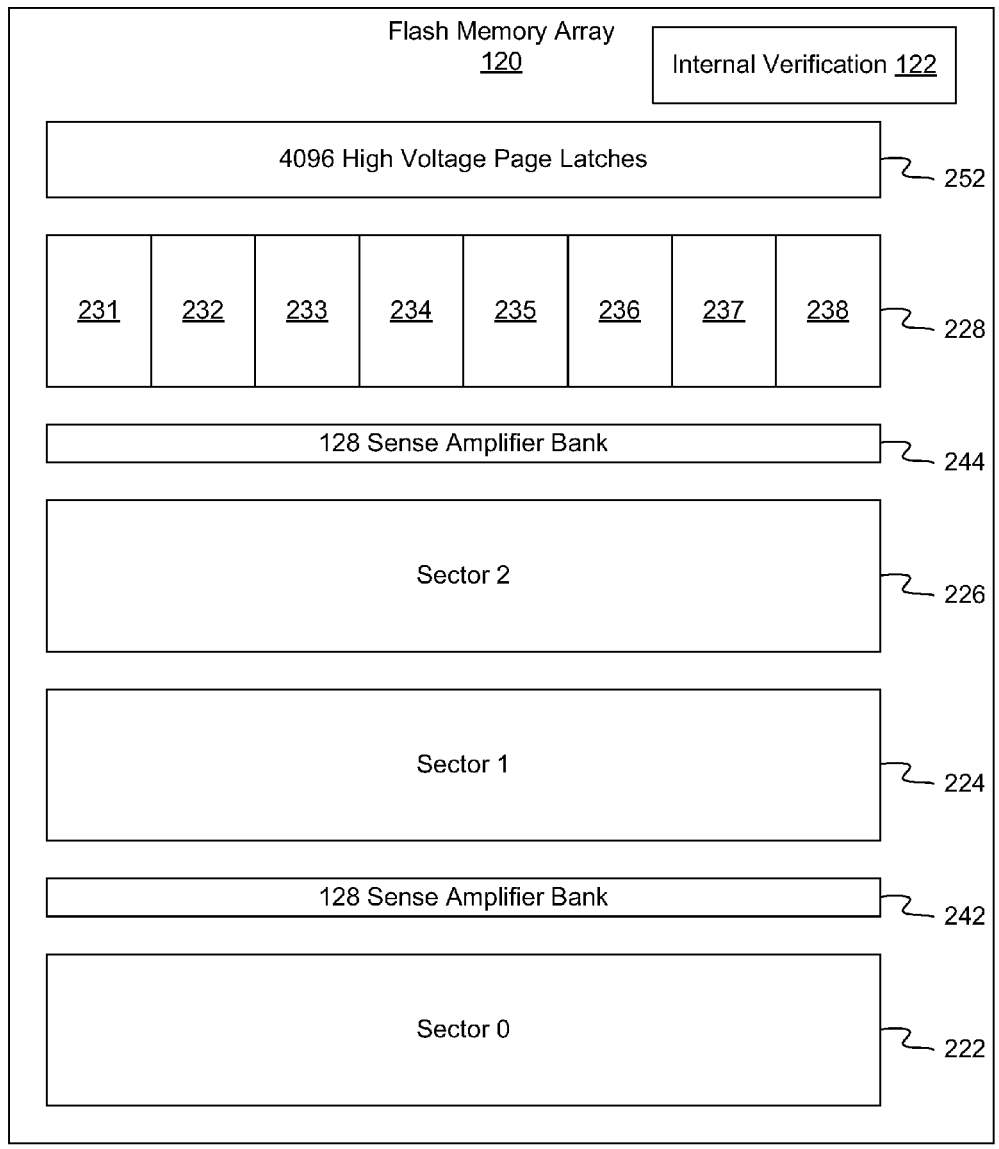
FIG. 2 is a block diagram illustrating a non-volatile memory array with internal data comparison for memory verification, according to an embodiment.

FIG. 2 is a block diagram illustrating a flash memory array with internal data comparison for memory verification, according to an embodiment of the present invention. In one embodiment, the flash memory array 120 is divided into normal sectors (Sectors 0-3) 222, 224, 226 and 228. In another embodiment, the flash memory array 120 may also include supervisory memory (SM) sectors (not shown). In one embodiment, each normal sector of the flash memory array 120 may include 256 rows and 4096 columns of memory cells. The memory cells may be, for example, two-transistor (2T) SONOS memory cells, however other memory cells may be used. The SM sectors may be formed from 64 rows and the 4096 columns. In other embodiments, the sectors may include some other number of memory cells. In one embodiment, each of the sectors may be further divided into 512 column sections, seen as eight separate vertical slices 231-238, illustrated for Sector 3 228. Although the slices are only illustrated for Sector 3 228, it should be understood that the slices 231-238 may include each sector of flash memory array 120. Each pair of sectors may share a sense amplifier (SA) bank of 128 sense amplifiers. Sector 0 222 and Sector 1 224 may share SA bank 242 and Sector 2 226 and Sector 3 228 may share SA bank 244. Thus, in one embodiment, each slice 231-238 may have 16 sense amplifiers, such that there is one sense amplifier for every 32 columns of the flash memory array 120. The 32 columns of one sector (e.g., Sector 3 228) may be multiplexed onto one of the differential pair inputs of the shared sense amplifier and the 32 columns of the other sector (e.g., Sector 2 226) are multiplexed onto the other differential pair input of the shared SA, as described further below.

In one embodiment, flash memory array 120 may additionally include a number of high voltage (HV) page latches 252 to store input data. In one embodiment, there may be one latch for each column of flash memory array 120 (i.e., 4096 HV page latches). Each HV page latch may drive a single global bit-line (GBL) per column. During a HV erase operation, each GBL may be driven to a positive pump voltage regardless of the data held in the HV page latches. During an HV program operation, each GBL may be driven to one of two levels depending on the data held in the corresponding HV page latch. For example, each GBL may be driven to a negative pump voltage to program a logic "1" (i.e., SONOS threshold voltage is greater than 0V) or to an inhibit voltage, (which may be a voltage between Vgnd and Vpwr) to inhibit (i.e., keep erased) a logic "0" (i.e., the SONOS threshold voltage is less than 0V) from programming.

In one embodiment, programming or writing data to an addressed row of memory cells in flash memory array 120 may include the following steps: 1) erasing all SONOS cells on the addressed row; 2) programming data held in the HV page latches into the SONOS cells of the addressed row; and 3) verifying the data read from the programmed row against data held in the HV page latches. In one embodiment, all SONOS cells on the addressed row may optionally be pre-programmed so that each SONOS cell sees a short maximum high voltage program pulse that takes the erase voltage threshold high so that on a subsequent erase pulse, the voltage threshold does not get driven into erase saturation, possibly causing damage to the SONOS stack.

In one embodiment, the programming data is fed into HV page latches 252 by a processing device, such as processing device 110 through interface 130. Once the programming data is written to a row of flash memory array 120 (e.g., in Sector 3 228), internal verification circuit 122 may be used to verify that the write was successful. The data written to the row may be read out into a sense amplifier in SA bank 244 and compared, by internal verification circuit 122 to the programming data which remains stored in HV page latches 252. A result of the comparison can be compressed and output by internal verification circuit 122, as will be described further below.

Figure 3:
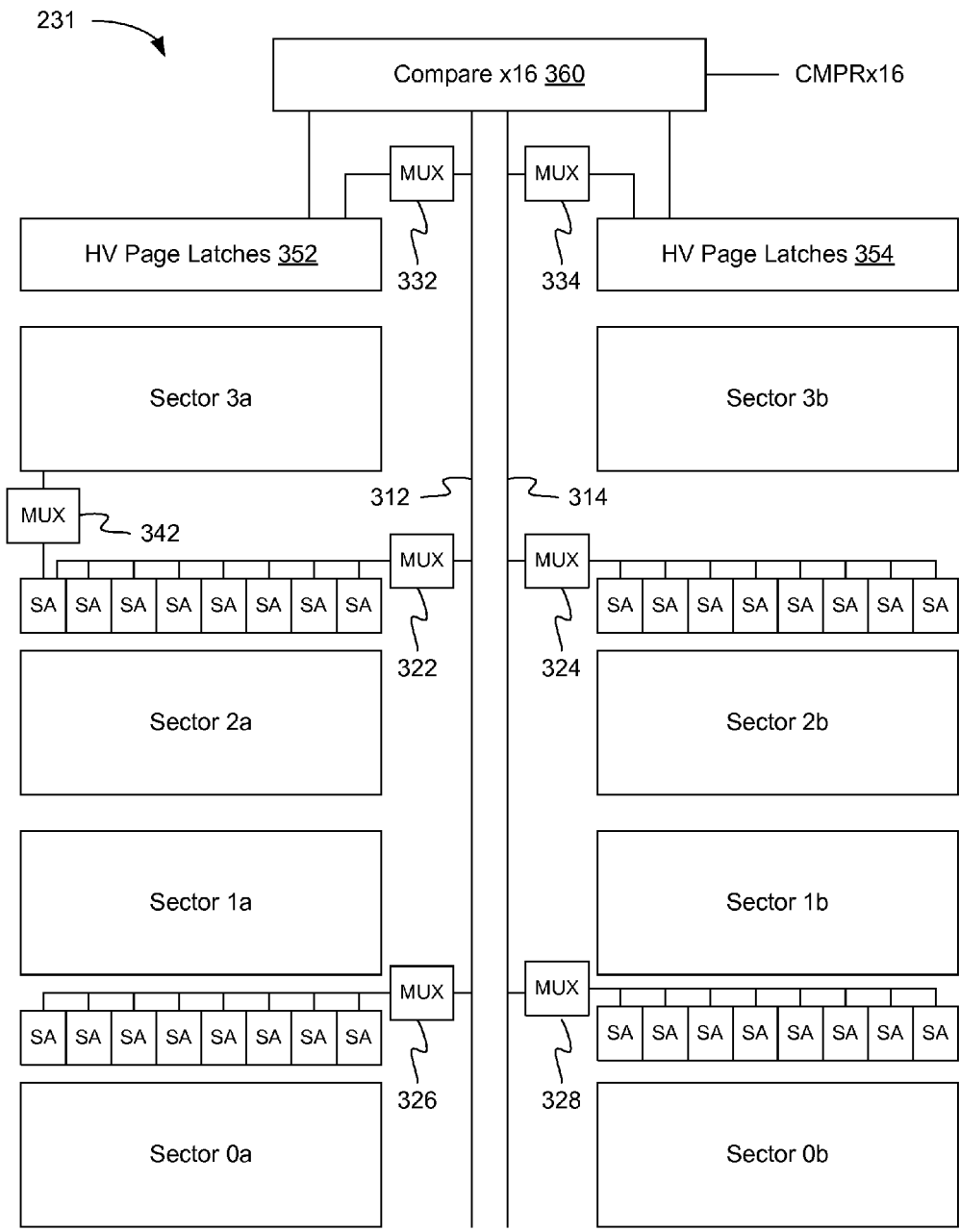
FIG. 3 is a block diagram illustrating an exemplary slice of a non-volatile memory array with internal data comparison for memory verification, according to an embodiment.

FIG. 3 is a block diagram illustrating an exemplary slice of a flash memory array with internal data comparison for memory verification, according to an embodiment of the present invention. In one embodiment the slice 231 may be one slice of flash memory array 120, as shown in FIG. 2, including sectors 0a, 0b, 1a, 1b, 2a, 2b, 3a, 3b. Slice 231 may be a representative slice and it should be understood that other slices from flash memory array 120 may have the same or a similar layout. In this embodiment, slice 231 includes output buses 312 and 314, to which the sense amplifier banks are multiplexed, through multiplexers 322, 324, 326 and 328. In one embodiment, each slice may include 16 sense amplifiers, with eight arranged on the left and eight arrange on the right of the output busses 312 and 314. Depending on which sector data was programmed to and from which sector the data is being verified, the appropriate multiplexer is enabled to drive the output buses 312 and 314. For example, if data is being verified from Sector 3a, multiplexers 322 and 324 may be enabled to drive data from the corresponding sense amplifiers to the output buses 312 and 314. In one embodiment, HV page latches 352 and 354 may additionally be connected to output buses 312 and 314 through multiplexers 332 and 334 so that the values of HV pages latches 352 and 354 may be read out directly.

As mentioned above, 32 columns of each sector may share a single sense amplifier (SA). Using a column decoder or a multiplexer, such as multiplexer 342, the value of individual columns of each sector for the given row may be applied to the corresponding sense amplifier. Although not illustrated in FIG. 3, it should be understood that each sense amplifier may have a similar column decoder or multiplexer to connect with the corresponding 32 columns of the sector. In addition, there may also be multiplexers to connect the columns of Sector 2a to the same sense amplifier, as each sense amplifier bank 244 may be shared by two sectors of flash memory array 120.

In one embodiment, slice 231 may additionally include comparison circuitry 360 that compares the outputs of the HV page latches 352 and 354 with the values on output buses 312 and 314 read from the sense amplifiers (and previously from the designated sector row). In one embodiment, comparison circuitry 360 may compare 16 values at a time from the sense amplifiers to the values in the pages latches corresponding to the same columns of flash memory array 120 (e.g., columns 1, 33, 65, etc.). In a subsequent comparison operation, the values from the next columns (e.g., columns 2, 24, 66, etc.) may be read from the sense amplifiers and compared to the corresponding page latch values. This comparison process may repeat until the values of each column in a given row have been compared to the page latches 352 and 354. Comparison circuitry 360 may include, for example, a processing device, a digital comparator, some combination of one or more logic gates or some other type of comparator.

In one embodiment, when the outputs of the HV page latches 352, 354 and the output buses 312, 314 match, a single bit CMPRx16 output may have a high logic value. Comparison circuitry 360 may perform a bit by bit comparison for each memory cell in the portion of the row read, and if one of the bits does not match the output of the HV page latch, the CMPRx16 output may have a low logic value. Thus, for each read operation, a 16 bit comparison (i.e., one for each sense amplifier in a slice) may be performed. These values may be combined to generate CMPRx16 for the slice 231, for example, using the compression circuit of FIG. 4A. For the whole flash memory array 120, eight CMPRx16 output signals may exist (i.e., one for each slice) and may be further compressed to a single compare output signal, for example, using the compression circuit of FIG. 4B. The single compare output signal can be accumulated for 32 reads per row so that at the end of a complete row read (consisting of 32×128 bit reads of the flash memory array) a single bit can then be checked to see if data on the row is verified or not.

In one embodiment, HV page latches 352, 254 hold digital information representing what will be, or what has been, programmed into the target row of the flash memory array 120. The actual memory cells of the flash memory array 120 may hold analog data in the form of minute output currents (or lack thereof) that may be compared against a reference current by the sense amplifiers. These small currents can be altered by the voltage placed on the selected SONOS word-line. By altering the SONOS word-line voltage successively and then reading data from the selected row after each change of the SONOS word-line voltage, a pass/fail voltage can be established. This pass/fail voltage point may be referred to as the margin voltage, and there may be one worst case margin voltage for programmed cells (VTP_MIN) and one for the erased cells (VTE_MAX). The process of finding the VTP_MIN and VTE_MAX may be called margin mode. Alternatively in margin mode, instead of finding the pass/fail point, what could be done is setting the SONOS word-line voltage or the margin voltage to a value for which the memory cells have margin across endurance (ENDR) and data retention (DRET), and then reading the row or rows. If the reads produce the correct data, then the memory cells have enough margins for reliable reads across the lifetime of the flash memory array 120. So now, instead of doing margin mode by reading out data (e.g., through interface 130) and comparing to data in SRAM or a tester, the comparisons can be performed internally to the flash memory array 120 and only a single compare bit needs to be checked per row.

Within margin mode, the adjustments of the sense amplifiers with regard to timing and the reference current input can be optimized for the best margins possible. The SONOS threshold voltage window may be defined as the space or difference between VTP_MIN and VTE_MAX. In one embodiment the threshold voltage window may be as large as possible and may be centered about a level that is slightly negative of 0V. As an example, if the threshold voltage window is too small, the sense amplifier timing can be relaxed (to the detriment to speed or access time) to allow more time to sense the memory cell current and this will open the threshold voltage window. However if the threshold voltage window is large relative to what is needed for reliable reads across the lifetime of the flash memory array 120, then speed can be improved by tightening the sense amplifier timing. Another example is when the threshold voltage window is not centered properly. In this situation, the sense amplifier reference current can be adjusted up or down to change the threshold voltage window up or down. There may, however, be limits to the adjustments that can be made, but this is one way of fine tuning the sense path relative to the SONOS threshold voltage window possibly across the entire flash memory array 120.

Figure 4A:
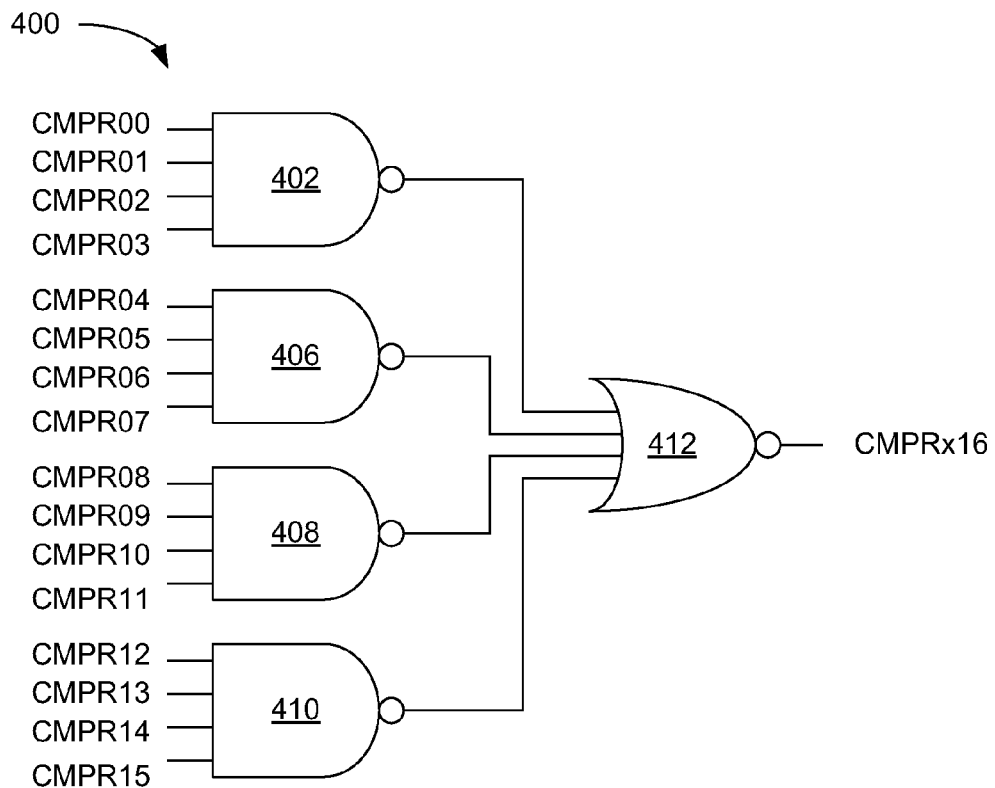
FIGS. 4A and 4B are logic diagrams illustrating compression circuits for compressing the results of an internal data comparison for memory verification according to an embodiment.

FIG. 4A is a logic diagram illustrating a compression circuit for compressing the results of an internal data comparison for memory verification according to an embodiment of the present invention. The illustrated compression circuit 400 is merely one example of how the compression may be performed, and it should be understood that in other embodiments, some other circuit arrangement may be used. In one embodiment compression circuit 400 may be located inside comparison circuit 360 of FIG. 3. In one embodiment, the result (CMPR00-CMPR16) of a comparison for the value in each of the 16 sense amplifiers in a slice of flash memory array 120, such as slice 231, are applied as inputs to NAND gates 402, 406, 408 and 410. The outputs of each of NAND gates 402, 406, 408 and 410 may be applied as inputs to NOR gate 412. The output of NOR gate 412 may be the compare output signal CMPRx16 for the read of this portion of the slice 231. The CMPRx16 signal from each slice of the array 120 may be further compressed as described below.

Figure 4B:
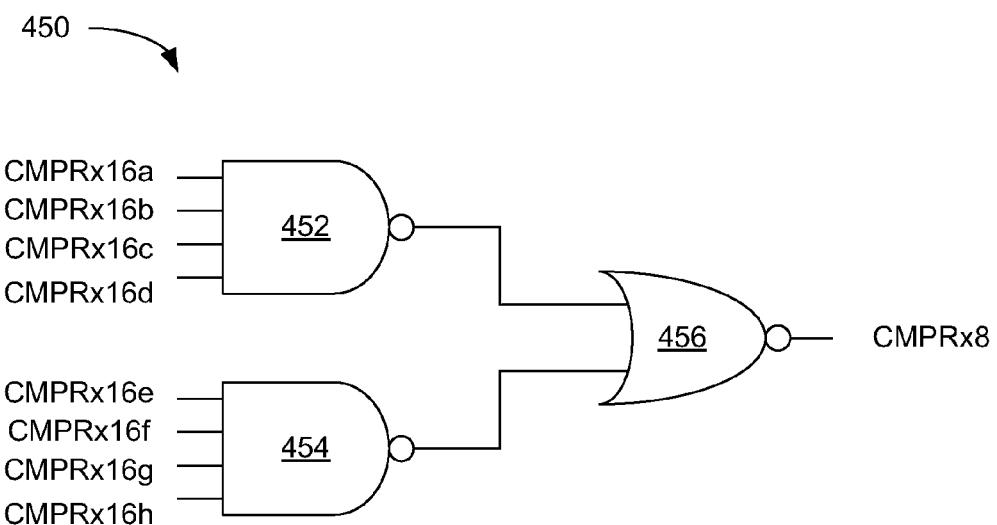

FIG. 4B is a logic diagram illustrating a compression circuit for compressing the results of an internal data comparison for memory verification according to an embodiment of the present invention. The illustrated compression circuit 450 is merely one example of how the compression may be performed, and it should be understood that in other embodiments, some other circuit arrangement may be used. In one embodiment, the outputs (CMPRx16) of comparison circuitry 360 for each slice are applied as inputs to NAND gates 452 and 454. In one embodiment, where the flash memory array includes eight slices, there are eight inputs CMPRx16*a*-CMPRx16*h* (i.e., one for each slice). For example, the input CMPRx16 a may correspond to the comparison output of slice 231, CMPRx16*b* may correspond to the comparison output of slice 232, and so on. The outputs of each of NAND gates 452 and 454 may be applied as inputs to NOR gate 456. The output of NOR gate 456 may be the single compare output signal CMPRx8 for this 128 bit portion of the current row of the flash memory array 120. This single bit may be read to verify whether or not the programming of the corresponding row was successful. In one embodiment, where each row of flash memory array 120 includes 4096 bits, 32 128 bit reads are used to verify the entire row. Thus, CMPRx8 may have 32 different values for the whole verification operation.

As discussed above, if the comparison performed by comparison circuitry 360 results in a match, the compare output is high (e.g., a logic "1"). If each of the inputs CMPRx16*a*-CMPRx16*h* to the NAND gates 452 and 454 are high, the output of each NAND gate 452 and 454 will be low (e.g., a logic "0"). Thus, the output CMPRx8 of NOR gate 456 will be high, indicating that all bits matched for this portion and the program was successful. If there were a mismatch in any of the bits, for example in slice 231, the CPRx16a signal would be low causing the output of NAND gate 452 to be high and the output signal CMPRx8 of NOR gate 456 will be low indicating an unsuccessful program. In that case, the program operation may be retried or the flash memory array 120 may be marked as faulty or damaged.

Figure 5:
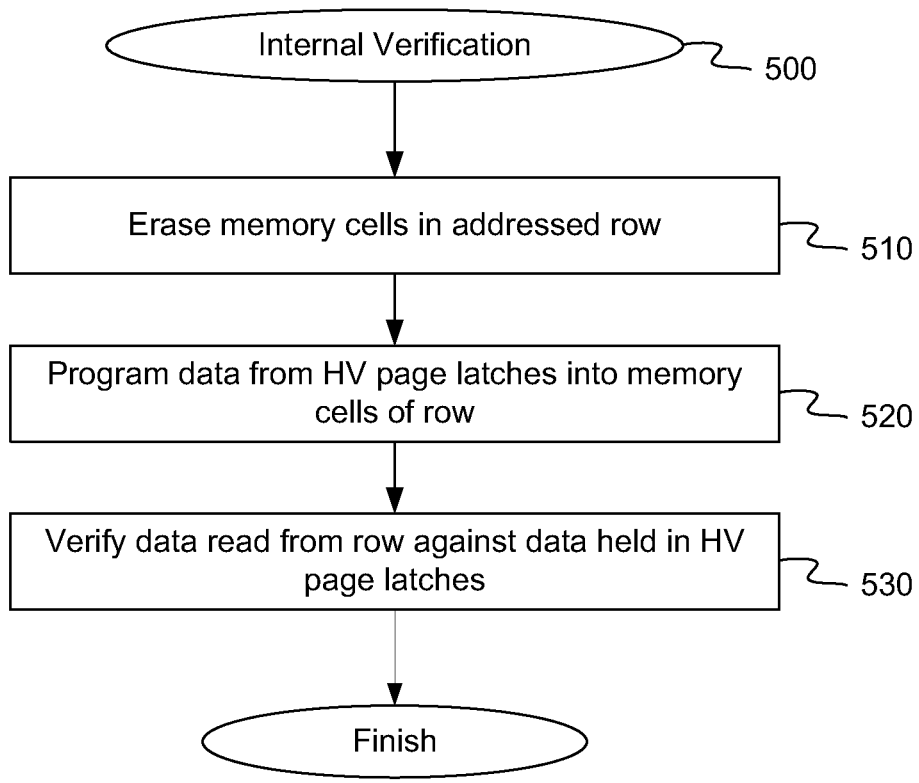
FIG. 5 is a flow diagram illustrating a method for internal data comparison for memory verification according to an embodiment.

FIG. 5 is a flow diagram illustrating a method for internal data comparison for memory verification according to an embodiment of the present invention. The method 500 may be performed by processing logic that comprises hardware (e.g., circuitry, dedicated logic, programmable logic, microcode, etc.), software (e.g., instructions run on a processing device to perform hardware simulation), or a combination thereof. The processing logic is configured to internally verify that a programming operation to a flash memory array was successful. In one embodiment, method 500 may be performed by internal verification circuit 122 and processing device 110, as shown in FIG. 1.

Referring to FIG. 5, at block 510, method 500 erases the memory cells in the addressed row. In one embodiment, each column of the flash memory array 120 is driven with a positive pump voltage and the addressed row is driven with a negative pump voltage. This will erase whatever data was stored in the memory cells of the addressed row. At block 520, method 500 programs data from HV page latches 252 into the memory cells of the addressed row. In one embodiment, the columns of flash memory array 120 are driven with a negative pump voltage or an inhibit voltage depending on the contents of the corresponding page latch, and the addressed row is driven with a positive pump voltage. For example, to program a logic "1," the column may be driven with the negative pump voltage and to program (or maintain) a logic "0," the column may be driven with the inhibit voltage. The programmed values also remain stored in the HV page latches 252. At block 530, method 500 verifies the data read from the addressed row against the data held in the HV page latches 252. In one embodiment the addressed row's SONOS word line is connected to ground and the just programmed data is read out. The data read from addressed row of flash memory array 120 is compared against the data remaining in the HV page latches 252 on a bit by bit basis. If the data does not match, the program operation is determined to be unsuccessful. Additional details of the verification process are described below with respect to FIG. 6.

Figure 6:
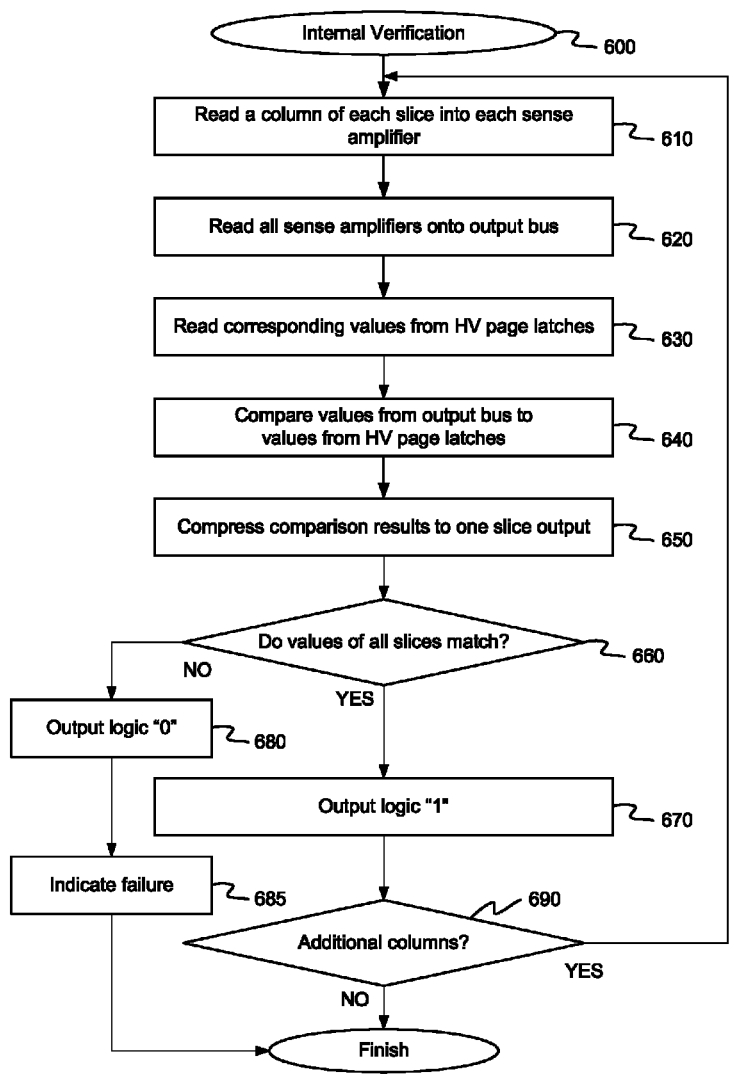
FIG. 6 is a flow diagram illustrating a method for internal data comparison for memory verification according to an embodiment.

FIG. 6 is a flow diagram illustrating a method for internal data comparison for memory verification according to an embodiment of the present invention. In method 600, the processing logic is configured to internally verify that a programming operation to a flash memory array was successful. The verification process may be instantiated automatically upon each program to row of the flash memory array. In one embodiment, method 600 may be performed by internal verification circuit 122 and processing device 110, as shown in FIG. 1.

Referring to FIG. 6, at block 610, method 600 reads multiple columns of each slice 231 of the flash memory array 120 into the sense amplifiers in SA bank 244. In one embodiment, there may be one sense amplifier in SA bank 244 for every 32 columns of the flash memory array 120. Each half of the slice 231 may include eight sense amplifiers, so 16 columns may be read into the sense amplifiers at a time. A column decoder or multiplexer, such as multiplexer 342 may read the columns into the corresponding sense amplifiers, where the value from the memory cell in the addressed row is stored.

At block 620, method 600 reads each sense amplifier in SA bank 244 onto the output bus 312 or 314 of each slice 231-238. The output busses 312 and 314 may be connected to the sense amplifiers through multiplexers, such as multiplexers 322 and 324. In one embodiment each of the eight sense amplifiers in each have of slice 231 are read onto the respective buses at once. The output buses 312 and 314 may be capable of transmitting all eight signals at once.

At block 630, method 600 reads the values from HV page latches 352 and 354 corresponding to the columns read into the sense amplifiers at block 610. In one embodiment, there may be a one-to-one correspondence between the page latches and the columns of the flash memory array. Thus, the values of the page latches corresponding to each column are read into comparison circuitry 360. In one embodiment the values may be applied to comparison circuitry 360 directly over a designated channel or channels. In another embodiment, multiplexers 332 and 334 may be used to read the values from the HV page latches 352 and 354 onto output buses 312 and 314.

At block 640, method 600 compares the values read from the sense amplifiers at block 620 onto the output buses to the values read from the HV page latches at block 630. In one embodiment, comparison circuitry 360 performs a bit-by-bit comparison of the sixteen data values (i.e., one from each sense amplifier) per slice. Comparison circuitry 360 may be implemented in any number of ways, including through the use of digital logic gates. The values may be considered to match if they have the same logic state (e.g., logic "0" or logic "1"). At block 650, method 600 compresses the sixteen results of the comparison from block 640 into one output CMPRx16 for each slice. In one embodiment, the compression may be performed by compression circuit 400 of FIG. 4A.

At block 660, method 600 further compresses the slice outputs CMPRx16 into one output CMPRx8 for the portion of the addressed row. In one embodiment, the compression may be performed by compression circuit 450 of FIG. 4B. Method 600 may further determine, based on the compressed output CMPRx8, if all of the values read from the sense amplifiers match all of the values read from the HV pages latches for the portion of each slice in the array 120. If at block 660 method 600 determines that the values read from the sense amplifiers and the values from the HV page latches match, at block 670, method 600 outputs a logic "1" as the value of CMPRx8. If at block 660, method 600 determines that the values read from the sense amplifiers and the values from the HV page latches do not match, at block 680, method 600 outputs a logic "0." This output for signal CMPRx8 may indicate that the program operation was not successful for this portion of the row of flash memory array 120. At block 685, method 600 may provide an indication (e.g., to a user, to an application in system 100) that the write to flash memory array 120 was not successfully verified.

At block 690, method 600 determines if there are additional columns in the slice 231 to verify. In one embodiment, since each sense amplifier is associated with 32 columns, the verification process may be repeated a total of 32 times. This enables verification of every memory cell in a row of flash memory array 120. The value of CMPRx8 may thus be updated for each new section of the flash memory array 120 that is verified. If at block 690 method 600 determines that there are additional columns, method 600 returns to block 610 and repeats the steps of block 610 through 685 for each remaining column. If at block 690 method 600 determines that there are no additional columns, method 600 finishes.

Figure 7:
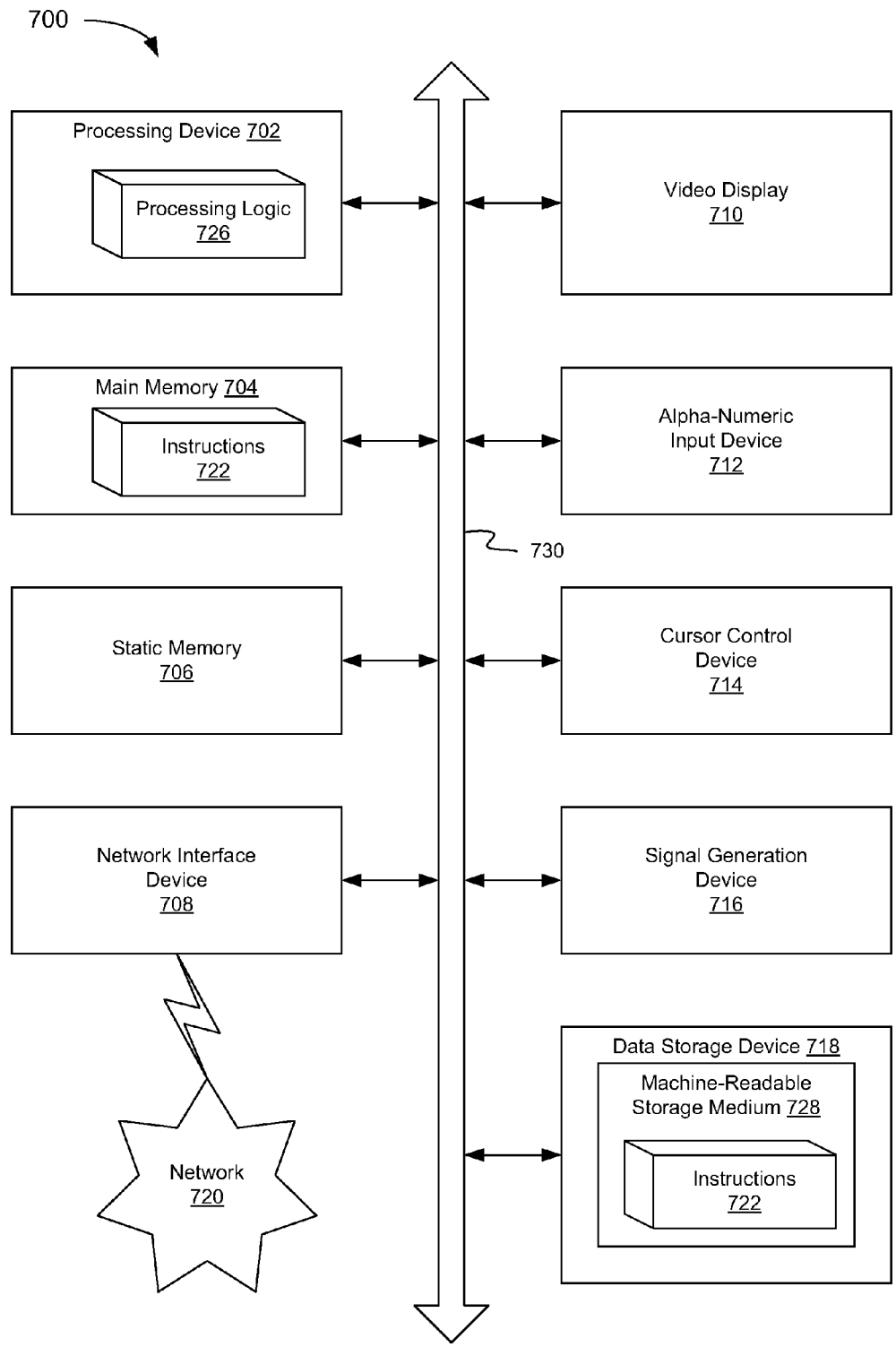
FIG. 7 is a block diagram illustrating one embodiment of a computer system, according to an embodiment.

FIG. 7 illustrates a diagrammatic representation of a machine in the exemplary form of a computer system 700 within which a set of instructions, for causing the machine to perform any one or more of the methodologies discussed herein, may be executed. In alternative embodiments, the machine may be connected (e.g., networked) to other machines in a local area network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein. In one embodiment, computer system 700 may be representative of computer system 100 in FIG. 1.

The exemplary computer system 700 includes a processing device 702, a main memory 704 (e.g., read-only memory (ROM), flash memory, dynamic random access memory (DRAM) (such as synchronous DRAM (SDRAM) or Rambus DRAM (RDRAM), etc.), a static memory 706 (e.g., flash memory, static random access memory (SRAM), etc.), and a data storage device 718, which communicate with each other via a bus 730. One of these memories may be representative of flash memory array 120. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Processing device 702 represents one or more general-purpose processing devices such as a microprocessor, central processing unit, or the like. More particularly, the processing device may be complex instruction set computing (CISC) microprocessor, reduced instruction set computer (RISC) microprocessor, very long instruction word (VLIW) microprocessor, or processor implementing other instruction sets, or processors implementing a combination of instruction sets. Processing device 702 may also be one or more special-purpose processing devices such as an application specific integrated circuit (ASIC), a field programmable gate array (FPGA), a digital signal processor (DSP), network processor, or the like. The processing device 702 is configured to execute processing logic 726 for performing the operations and steps discussed herein.

The computer system 700 may further include a network interface device 708. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), and a signal generation device 716 (e.g., a speaker).

The data storage device 718 may include a machine-accessible storage medium 728, on which is stored one or more set of instructions 722 (e.g., software) embodying any one or more of the methodologies of functions described herein. The instructions 722 may also reside, completely or at least partially, within the main memory 704 and/or within the processing device 702 during execution thereof by the computer system 700; the main memory 704 and the processing device 702 also constituting machine-accessible storage media. The instructions 722 may further be transmitted or received over a network 720 via the network interface device 708.

The machine-readable storage medium 728 may also be used to store instructions to perform a method for internal data comparison for memory verification, as described herein. While the machine-readable storage medium 728 is shown in an exemplary embodiment to be a single medium, the term "machine-readable storage medium" should be taken to include a single medium or multiple media (e.g., a centralized or distributed database, and/or associated caches and servers) that store the one or more sets of instructions. A machine-readable medium includes any mechanism for storing information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; or another type of medium suitable for storing electronic instructions.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

Embodiments of the present invention include various operations described herein. These operations may be performed by hardware components, software, firmware, or a combination thereof. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; or another type of medium suitable for storing electronic instructions.

Additionally, some embodiments may be practiced in distributed computing environments where the machine-readable medium is stored on and/or executed by more than one computer system. In addition, the information transferred between computer systems may either be pulled or pushed across the communication medium connecting the computer systems.

The digital processing devices described herein may include one or more general-purpose processing devices such as a microprocessor or central processing unit, a controller, or the like. Alternatively, the digital processing device may include one or more special-purpose processing devices such as a digital signal processor (DSP), an application specific integrated circuit (ASIC), a field programmable gate array (FPGA), or the like. In an alternative embodiment, for example, the digital processing device may be a network processor having multiple processors including a core unit and multiple microengines. Additionally, the digital processing device may include any combination of general-purpose processing devices and special-purpose processing devices.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

What is claimed is:

1. A method, comprising:
   programming, by a processing device, data into a row of a non-volatile memory array, wherein the row comprises data across a plurality of slices of the non-volatile memory array; and
   verifying, internally to the non-volatile memory array, that the data in the row across each of the plurality of slices was successfully programmed, wherein the verifying comprises:
   reading the programmed data from the row of the non-volatile memory array into a plurality of sense amplifiers;
   comparing the data in the plurality of sense amplifiers to data stored within the non-volatile memory array; and
   if the data in the plurality of sense amplifiers matches the data stored within the non-volatile memory array, determining that the data was successfully programmed.

2. The method of claim 1, wherein programming the data into the row of the non-volatile memory array comprises writing the data from a plurality of page latches in the non-volatile memory array to a plurality of memory cells in the row.

3. The method of claim 2, wherein the verifying comprises comparing the programmed data from the row of the non-volatile memory array to the data stored within the non-volatile memory array in the plurality of page latches.

4. The method of claim 3, wherein the comparing comprises:
   applying the data from the plurality of sense amplifiers to a comparison circuit in the non-volatile memory array.

5. The method of claim 3, wherein the comparing comprises determining if a plurality of bits in the row of the non-volatile memory array matches a plurality of bits in the plurality of page latches.

6. The method of claim 5, further comprising:
   if a plurality of bits in the row of the non-volatile memory array matches a plurality of bits in the plurality of page latches, generating an indication that the data was successfully programmed.

7. The method of claim 1, wherein the method further comprises:
   generating an indication for each of the plurality of slices that the data in the row in a corresponding slice was successfully programmed; and
   compressing the indications for the plurality of slices into a single indication for the row across all of the plurality of slices of the non-volatile memory array.

8. An apparatus, comprising:
   a processing device; and
   a non-volatile memory array coupled to the processing device, the non-volatile memory array comprising:
   a plurality of memory cells arranged into one or more rows across a plurality of slices of the non-volatile memory array;
   a plurality of sense amplifiers to read data from the plurality of memory cells; and
   an internal verification circuit to verify that data is successfully programmed to the plurality of memory cells in a row across the plurality of slices, wherein the internal verification circuit comprises a comparison circuit to compare the data from the plurality of sense amplifiers to data stored within the non-volatile memory array.

9. The apparatus of claim 8, wherein the non-volatile memory array further comprises:
a plurality of page latches to write the data to the plurality of memory cells, the plurality of page latches to store the data within the non-volatile memory array.

10. The apparatus of claim 8, wherein the non-volatile memory array further comprises:
an output bus coupled between the plurality of sense amplifiers and the comparison circuit.

11. The apparatus of claim 8, wherein the internal verification circuit is configured to generate an indication for each of the plurality of slices that the data in the row of a corresponding slice was successfully programmed.

12. The apparatus of claim 11, wherein the internal verification circuit further comprises a compression circuit to compress the indications for the row across the plurality of slices into a single indication for the row across each of the plurality of slices in the non-volatile memory array.

13. A method comprising:
reading a value from a memory cell in a row across a plurality of slices of a non-volatile memory array into a sense amplifier;
reading the value stored in the sense amplifier onto an output bus;
comparing, by a comparison circuit, the value on the output bus to a value in a page latch corresponding to the memory cell, the page latch located within the non-volatile memory array;
if the value on the output bus matches the value in the page latch, generating an indication that a program operation to the non-volatile memory array was successful; and
compressing the indication with a plurality of other indications to generate a single indication for the row across the plurality of slices of the non-volatile memory array.

14. The method of claim 13, wherein the value in the memory cell of the non-volatile memory array is programmed into the memory cell based on the value in the page latch corresponding to the memory cell.

15. The method of claim 13, wherein the comparing comprises applying the value from the output bus and the value from the page latch to a comparison circuit in the non-volatile memory array.

16. The method of claim 13, wherein the comparing comprises determining if the value from the output bus and the value from the page latch have a same logic state.

17. The method of claim 13, further comprising:
if the value on the output bus does not match the value in the page latch, generating an indication that the program operation to the non-volatile memory array was unsuccessful.

* * * * *